United States Patent [19]

Kanbe et al.

[11] 4,423,133
[45] Dec. 27, 1983

[54] PHOTOCONDUCTIVE MEMBER OF AMORPHOUS SILICON

[75] Inventors: Junichiro Kanbe, Yokohama; Shigeru Shirai, Yamato; Kyosuke Ogawa, Sakurashin; Keishi Saitoh, Tokyo; Yoichi Osato, Yokohama, all of Japan

[73] Assignee: Canon Kabushiki Kaisha, Tokyo, Japan

[21] Appl. No.: 440,639

[22] Filed: Nov. 10, 1982

[30] Foreign Application Priority Data

Nov. 17, 1981 [JP] Japan .................................. 56-184639
Dec. 24, 1981 [JP] Japan .................................. 56-215486
Dec. 24, 1981 [JP] Japan .................................. 56-215487

[51] Int. Cl.³ .............................................. G03G 5/082
[52] U.S. Cl. ........................................ 430/95; 430/84; 252/501.1; 427/39
[58] Field of Search .......................... 430/95, 86, 84; 252/512, 501.1

[56] References Cited

U.S. PATENT DOCUMENTS

| | | | |
|---|---|---|---|
| 3,210,184 | 10/1965 | Uhlig | 430/65 |
| 4,217,374 | 8/1980 | Ovshinsky et al. | 430/84 X |
| 4,226,898 | 10/1980 | Ovshinsky et al. | 430/84 X |
| 4,251,289 | 2/1981 | Moustakas et al. | 204/192 |
| 4,253,882 | 3/1981 | Dalal | 427/74 X |
| 4,265,991 | 5/1981 | Hirai et al. | 430/65 X |
| 4,289,822 | 9/1981 | Shimada et al. | 427/74 X |
| 4,365,013 | 12/1982 | Ishioka et al. | 430/84 X |

FOREIGN PATENT DOCUMENTS

49/15219 4/1974 Japan ............................ 430/88

Primary Examiner—John D. Welsh
Attorney, Agent, or Firm—Fitzpatrick, Cella, Harper & Scinto

[57] ABSTRACT

A photoconductive layer comprises a support and an amorphous layer. The amorphous layer is photoconductive, comprises silicon as matrix and hydrogen and/or halogen, and has a layer region containing group III atoms which is distributed such that the distribution is continuous in the direction of layer thickness and said atoms are more enriched on the aforesaid support side than on the opposite side to the aforesaid support side in said layer.

26 Claims, 28 Drawing Figures

PHOTOCONDUCTIVE MEMBER OF AMORPHOUS SILICON

BACKGROUND OF THE INVENTION

1. Field of the Invention

This invention relates to a photoconductive member having sensitivity to electromagnetic waves such as light (herein used in a broad sense, including untraviolet rays, visible light, infrared rays, X-rays and gamma-rays and the like.

2. Description of the Prior Arts

Photoconductive materials constituting image forming members for solid state image pick-up devices, electrophotographic image forming members in the field of image formation, or manuscript reading devices are required to have a high sensitivity, a high SN ratio (Photocurrent ($I_p$)/Dark current ($I_d$)), absorption spectral characteristics matching to the spectral characteristics of irradiating electromagnetic waves, a good response to light, a desired dark resistance value as well as no harm to human bodies during usage. Further, in a solid state image pick-up device, it is also required that the residual image should be easily treated within a predetermined time. In particular, in case of an image forming member for electrophotography to be assembled in an electrophotographic device to be used in an office as office apparatus, the aforesaid harmless characteristic is very important.

From the standpoint as mentioned above, amorphous silicon (hereinafter referred to as "a-Si") has recently attracted attention as a photoconductive material. For example, German Laid-Open Patent Publication Nos. 2746967 and 2855718 disclose applications of a-Si for use in image forming members for electrophotography, and German Laid-Open Patent Publication No. 2933411 and application of a-Si for use in a photoconverting reading device.

However, under the present situation, although the photoconductive members having photoconductive layers constituted of a-Si of the prior art have been attempted to be improved with respect to individual characteristics, including various electrical, optical and photoconductive characteristics such as dark resistance value, photosensitivity and response to light, environmental characteristics in use, and further stability with lapse of time and durability, there exists room for further improvement in overall characteristics.

For instance, when the a-Si photoconductor is applied to an image forming member for an electrophotographic device, residual potential is frequently observed to remain during use thereof if increase in photosensitivity and dark resistance are contemplated. When such a photoconductive member is repeatedly used for a long time, there will be caused various inconveniences such as accumulation of fatigues by repeated uses or so-called ghost phenomenon wherein residual images are formed.

Further, a-Si materials may contain as constituent atoms hydrogen atoms or halogen atoms such as fluorine atoms, chlorine atoms, etc. for improving their electrical, photoconductive characteristics, and boron atoms, phosphrous atoms, etc. for controlling the electroconductivity type, and further other atoms for improving other characteristics. Depending on the manner in which these constituent atoms are contained, there may sometimes be caused problems with respect to electrical or photoconductive characteristics or dielectric strength of the layer formed.

That is, for example, in some cases, the life of the photocarriers generated by light irradiation in the photoconductive layer formed was insufficient, or at the dark portion, the charges injected from the support side could not be sufficiently impeded.

Thus, it is required in designing a photoconductive material to make efforts to overcome all of such problems as mentioned above along with the improvement of a-Si materials per se.

In view of the above points, the present invention contemplates the achievement obtained as a result of extensive studies made comprehensively from the standpoints of applicability and utility of a-Si as a photoconductive member for image forming members for electrophotography, solid state pick-up devices and reading devices etc.. It has now been found that a photoconductive member having a photoconductive layer comprising an amorphous material constituted of at least one of hydrogen atom (H) and halogen atoms (X) in a matrix of silicon (hereinafter referred to comprehensively as a-Si(H,X)), (for example, so-called hydrogenated amorphous silicon, halogenated amorphous silicon or halogen-containing hydrogenated amorphous silicon), exhibits not only practically extremely good characteristics, but also surpasses conventional photoconductive members in substantially all aspects, provided that the photoconductive member is constituted to have a specific layer structure as explained in the following. The photoconductive member has markedly excellent characteristics for electrophotography.

The present invention is based on the above mentioned discovery.

SUMMARY OF THE INVENTION

An object of the present invention is to provide a photoconductive member having constantly stable electrical, optical and photoconductive characteristics, suffering from substantially no influence from the use environment.

Another object of the present invention is to provide a photoconductive member markedly excellent in light fatique resistance, excellent in durability without causing any deterioration phenomenon after repeated uses and entirely or substantially free from residual potentials.

Another object of the present invention is to provide a photoconductive member, which is sufficiently capable of bearing charges at the time of charging treatment for formation of electrostatic charges to an extent that a conventional electrophotographic method can be very effectively applied when it is provided for use as an image forming member for electrophotography.

Still another object of the present invention is to provide a photoconductive member for electrophotography capable of providing easily a high quality image which is high in density, clear in halftone and high in resolution.

Still another object of the present invention is to provide a photoconductive member having high photosensitivity, high SN ratio characteristic and high dielectric strength.

According to the present invention, there is provided a photoconductive member which comprises a support for a photoconductive member and an amorphous layer having photoconductivity constituted of an amorphous material (a-Si(H,X)) comprising silicon atoms as a matrix and at least one member selected from hydrogen atomes (H) and halogen atoms (X) as constituent atoms, said amorphous layer having a layer region which contains atoms belonging to the group III of the periodic table as constituent atoms in such a distribution that the distribution is continuous in the direction of layer thickness and said atoms are more enriched on the aforesaid support side than on the opposite side to the aforesaid support side in said layer.

According to another aspect of the present invention, there is provided a photoconductive member which comprises a support for a photoconductive member and an amorphous layer having photoconductivity constituted of an amorphous material (a-Si(H,X)) comprising silicon atoms as a matrix and at least one member selected from hydrogen atoms and halogen atoms as constituent atoms, said amorphous layer having a first layer region which contains oxygen atoms as constituent atoms in a substantially uniform distribution which is continuous in the direction of layer thickness and a second layer region which contains atoms belonging to the group III of the periodic table as constituent atoms in such a distribution that the distribution is continuous in the direction of layer thickness and said atoms are more enriched on the aforesaid support side in said layer.

According to a further aspect of the present invention, there is provided a photoconductive member as set forth in the another aspect as mentioned above in which said first region exists internally below the surface of said amorphous layer.

DETAILED DESCRIPTION OF THE PREFERRED EMBODIMENTS

Figure 1:
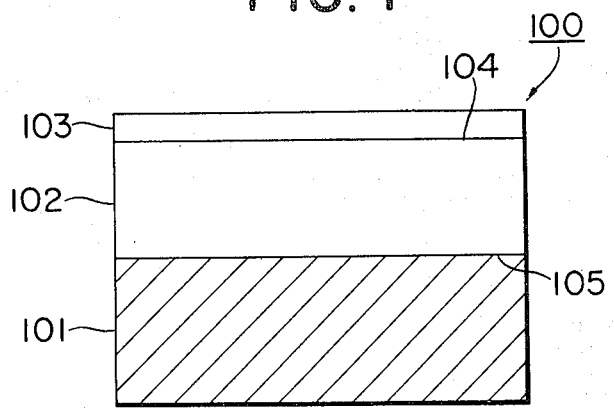
FIG. 1, FIG. 11 and FIG. 12 show schematic sectional views for illustration of the layer constitution of preferred embodiments of the photoconductive member according to the present invention.

Referring now to the drawing, the photoconductive members according to the present invention are to be described in detail below.

FIG. 1 shows a schematic sectional view for illustration of a typical exemplary constitution of the photoconductive member of this invention.

The photoconductive member 100 as shown in FIG. 1 has a layer structure having an amorphous layer 102 comprising a-Si(H,X) having photoconductivity provided on a support 101 for photoconductive member and an upper barrier layer (surface barrier layer) 103 optionally provided on said amorphous layer 102, said amorphous layer having a layer region (III) containing atoms of an element belonging to the group III of the periodic table as constituent atoms. The atoms belonging to the group III of the periodic table are contained in said layer region (III) continuously in the direction of layer thickness of the amorphous layer 102 and in such a distribution that they are more enriched in said layer on the support side (the side of the surface 105) of the amorphous layer (102) than on the opposite side (the side of the surface 103 of the amorphous layer 102) to the side at which said support is provided.

In the present invention, the atoms belonging to the group III of the periodic table to be incorporated in the layer region (III) constituting the amorphous layer may include B (boron), Al (aluminum), Ga (gallium), In (indium) and Tl (thallium) and the like. Among them, B and Ga are particularly preferred.

In the present invention, the distribution of said group III atoms contained in the layer region (III) constituting the amorphous layer is such that they are contained in larger amount in the lower surface (105) side of the amorphous layer than in the upper surface (104) side of the amorphous layer.

In the present invention, while the group III atoms contained in the layer region (III) takes such a distribution as mentioned above in the direction of layer thickness, they are made uniformly distributed in the direction parallel to the surface of a support.

FIGS. 2 through 10 show typical examples of the distribution in the direction of layer thickness of the group III atoms contained in the layer region (III) of the amorphous layer in the photoconductive member according to the present invention.

In FIGS. 2 through 10, the abscissa indicates the content C of the group III atoms and the ordinate the layer thickness of the layer region (III) containing the group III atoms constituting the amorphous layer exhibiting photoconductivity, $t_B$ showing the position of the interface on the support side and $t_T$ the position of the interface on the side opposite to the support side. That is, the layer region (III) containing the group III atoms is formed from the $t_B$ side toward the $t_T$ side.

In the present invention, the layer region (III) containing the group III atoms consists of a-Si(H,X) constituting the photoconductive member, and it may occupy either the whole region of the amorphous layer exhibiting photoconductivity or a part thereof.

In the present invention, when the aforesaid layer region (III) occupies a part of the amorphous layer, it is preferred in an example shown in FIG. 1 that said layer should be provided as the lower layer region of the amorphous layer 102 containing the interface 105 on the side of the support 101.

Figure 2:
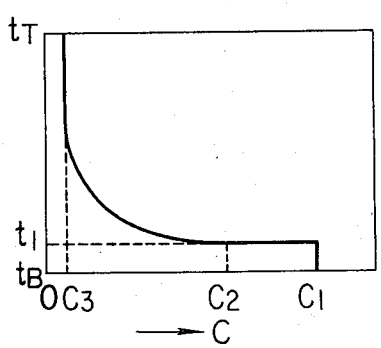
FIGS. 2 through 10 and FIGS. 14 through 28 show profile carts for illustration of the distributions of the atoms of the group III of the periodic table in a layer region (III) containing the atoms of the group III constituting amorphous layers, respectively.

In FIG. 2, there is shown a first typical example of the distribution of the group III atoms in the layer thickness direction contained in the amorphous layer.

According to the example as shown in FIG. 2, from the interface position $t_B$ to the other interface position $t_1$, the group III atoms are contained in the layer region formed with the concentration of the group III atoms taking a constant value of $C_1$, and from the position $t_1$ to the interface position $t_T$, the concentration being gradually decreased from the concentration $C_2$. At the interface position $t_T$, the concentration C of the group III atoms is made $C_3$.

Figure 3:
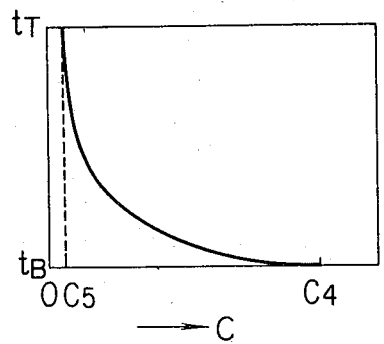

In the example as shown in FIG. 3, there is created a distribution such that the concentration C of the group III atoms is continuously gradually decreased from the position $t_B$ to the position $t_T$ from the concentration $C_4$, until it becomes the concentration $C_5$ at the position $t_T$.

Figure 4:
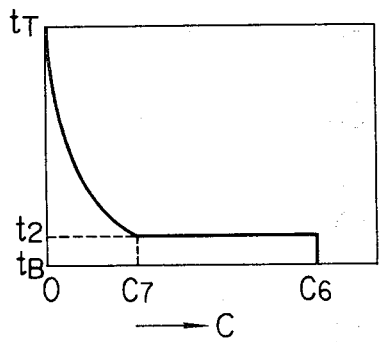

In case of FIG. 4, the concentration C of the group III atoms is maintained at a constant value of $C_6$ from the position $t_B$ to the position $t_2$, gradually continuously decreased between the position $t_2$ and the position $t_T$, and at the position $t_T$ the concentration C is made substantially zero.

Figure 5:
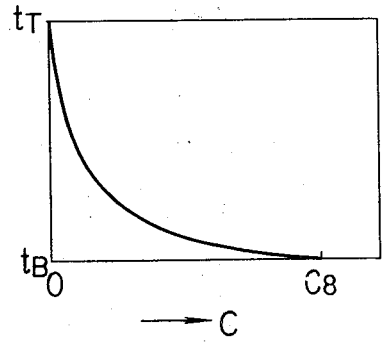

In case of FIG. 5, the group III atoms are continuously gradually decreased in concentration from the concentration $C_8$ from the position $t_B$ to the position $t_T$ at which the concentration is made substantially zero.

Figure 6:
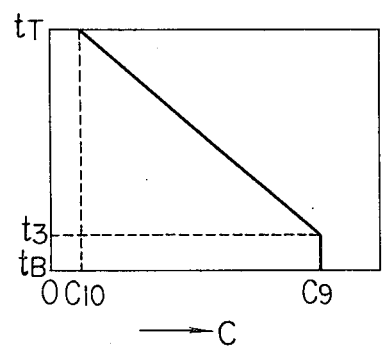

In the example shown in FIG. 6, the concentration C of the group III atoms is maintained at a constant value of $C_9$ from the position $t_B$ to $t_3$ and is made $C_{10}$ at the position $t_T$. Between the position $t_3$ and the position $t_T$, the concentration C is decreased in a linear function from the position $t_3$ to the position $t_T$.

Figure 7:
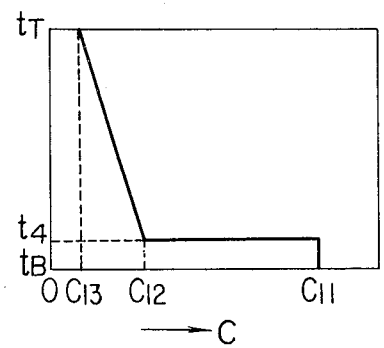

In the example as shown in FIG. 7, the distribution is made such that a constant value of $C_{11}$ is taken from the position $t_B$ to the position $t_4$, and the concentration C is decreased in a linear function from the concentration $C_{12}$ to the concentration $C_{13}$ from the position $t_4$ to the position $t_T$.

Figure 8:
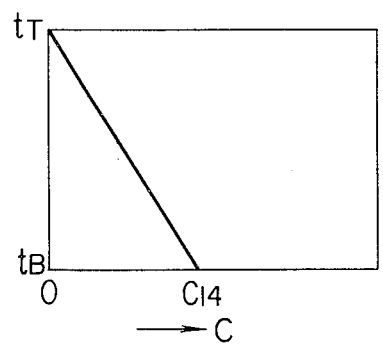

In the example as shown in FIG. 8, the concentration C of the group III atoms is decreased from the position $t_B$ to the position $t_T$ in a linear function from the concentration $C_{14}$ to zero.

Figure 9:
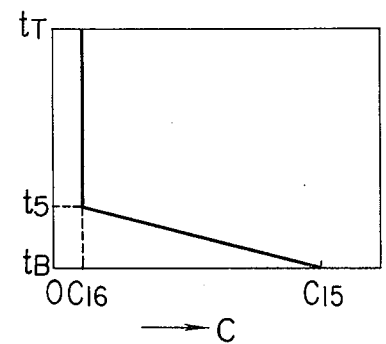

In FIG. 9, there is shown an example in which the concentration C of the group III atoms is decreased from the position $t_B$ to the position $t_5$ in a linear function from the concentration $C_{15}$ to the concentration $C_{16}$, and maintained at a constant value of $C_{16}$ between the position $t_5$ and the position $t_T$.

Figure 10:
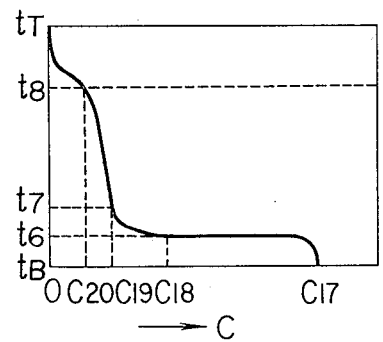

In the example as shown in FIG. 10, the concentration C of the group III atoms is the concentration $C_{17}$ at the position $t_B$, which is then initially gradually decreased to the position $t_6$ and abruptly decreased near the position $t_6$ to the concentration $C_{18}$ at position $t_6$. Between the position $t_6$ and the position $t_7$, the concentration is abruptly decreased at the beginning and then gradually decreased and becomes the concentration $C_{19}$ at the position $t_7$, and between the position $t_7$ and the position $t_8$, with a very gradual decrease, reaches the concentration $C_{20}$ at $t_8$. Between the position $t_8$ and the position $t_T$, the concentration is decreased from $C_{20}$ along the curve as shown in the drawing to substantially zero.

In the above, there are shown some typical examples of the distributions in the layer thickness direction of the group III atoms contained in the layer region (III) constituting the amorphous layer of the present photoconductive member by referring to the FIG. 2 to FIG. 10. In the present invention, there is provided in the amorphous layer a layer region (III), having a portion with higher value of the concentration C of the group III atoms on the support side, and having a portion with said concentration C which has been made considerably lower on the interface $t_T$ side, as compared with that on the support side.

In the present invention, the layer region (III) containing the group III atoms constituting the amorphous layer has a localized region (A) containing the group III atoms at higher concentration on the support side as described above.

The localized region (A) may preferably be provided at a position, in terms of the symbols shown in FIGS. 2 to 10, within $5\mu$ from the interface position $t_B$.

In the present invention, in such a case as described above, the above localized region (A) may be made the whole layer region ($L_T$) ranging from the interface position $t_B$ to the 5-micron thickness in some cases, or a part thereof in other cases.

It may be suitably determined depending on the characteristics required for the amorphous layer formed, whether the localized region (A) should be made a part or whole of the layer region ($L_T$).

The localized region (A) may be desirably formed so that the group III atoms may be distributed in the layer thickness direction with the maximum distribution value of the group III atoms (concentration distribution value) $C_{max}$ being generally 50 atomic ppm or more, preferably 80 atomic ppm or more, most preferably 100 atomic ppm or more, based on silocon atoms.

That is, in the present invention, the layer region (III) containing the group III atoms may be preferably formed so that the maximum value $C_{max}$ of the content distribution may exist at a depth within $5\mu$ of layer thickness from the support side (layer region of $5\mu$ thickness from $t_B$).

In the present invention, the content of the group III atoms to be contained in the aforesaid layer region (III) may be suitably determined as desired to achieve the object of the present invention, but it is generally in the range from 0.01 to $5 \times 10^4$ atomic ppm, preferably from 1 to 100 atomic ppm, more preferably from 2 to 50 atomic ppm, most preferably from 3 to 20 atomic ppm, based on silicon atoms constituting the layer region (III).

Figure 11:
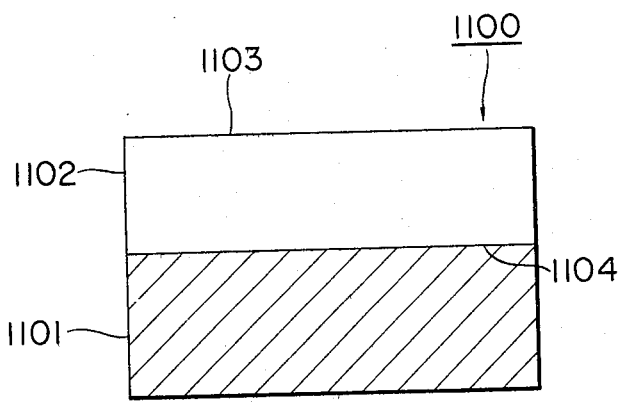

FIG. 11 shows schematically a layer constitution of the photoconductive member according to the second embodiment of the present invention.

The photoconductive member 1100 shown in FIG. 11 has an amorphous layer 1102 having photoconductivity comprising a-Si(H,X) on a support 1101 for photoconductive member, said amorphous layer 1102 having the layer region (O) containing oxygen atoms as constituent atoms and the layer region (III) containing atoms belonging to the group III of the periodic table. The oxygen atoms contained in said layer region (O) are distributed continuously and substantially uniformly in the layer thickness direction, and contained in said layer region (O) also in substantially uniform distribution in a plane substantially parallel to the interface 1104 between the support 1101 and the amorphous layer 1102.

The atoms belonging to the group III of the periodic table contained in the layer region (III) constituting the amorphous layer 1102 of the photoconductive member 1100 shown in FIG. 11 are contained in said layer region (III) so that they may be distributed continuously in the layer thickness direction and more enriched on the support side (the interface 1104 side between the support 1101 and the amorphous layer 1102) than on the side (the free surface 1103 side of the amorphous layer 1102) opposite to the support side. The situation is similar to that in case of the layer region (III) in FIG. 1.

The layer region (III) in the photoconductive member shown in FIG. 11 may be constituted of the same material as the layer region (III) in the photoconductive member shown in FIG. 1, and the distributions of the group III atoms in said layer region (III) can be similar to those as shown in FIG. 2 through FIG. 10.

In the present invention, in case of the photoconductive member 1100 shown in FIG. 11, the layer region (III) constituting the amorphous layer 1102 may occupy the whole layer region of the amorphous layer 1102 or a part of the layer region of the amorphous layer 1102, similarly as described in case of the photoconductive member 100 in FIG. 1. The layer region (O) constituting the amorphous layer 1102 is formed so that it may occupy the whole layer region of the amorphous layer 1102.

In short, in case of the photoconductive member 1100 shown in FIG. 11, the oxygen atoms are contained in uniform distribution without localization throughout the whole layer region of the amorphous layer 1102, and in at least a part of the layer region of the amorphous layer 1102, there are contained the group III atoms in said layer region such that the larger amount is distributed toward the side of the support 1101.

In the present invention, in case of a photoconductive member having a layer constitution as shown in FIG. 11, the content of the group III atoms in the aforesaid layer region (III) may be suitably determined as desired so as to achieve effectively the object of the present invention, but it is generally 0.01 to $5 \times 10^4$ atomic ppm, preferably 1 to $3 \times 10^4$ atomic ppm, more preferably 2 to 500 atomic ppm, most preferably 3 to 200 atomic ppm.

The amount of oxygen atoms contained in the layer region (O) may be determined suitably depending on the characteristics required for the photoconductive member corresponding to the object of the present invention, and may be in usual cases 0.001 to 30 atomic %, preferably 0.002 to 20 atomic %, most preferably 0.003 to 10 atomic %.

Figure 12:
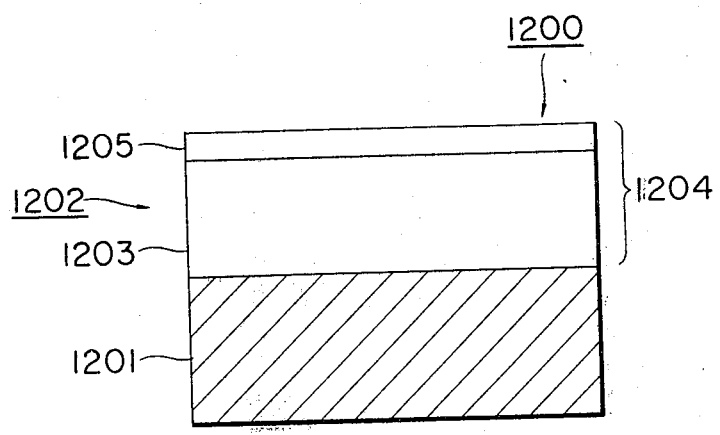

FIG. 12 shows schematically a layer constitution of the photoconductive member according to the third embodiment of the present invention.

The photoconductive member 1200 shown in FIG. 12 has an amorphous layer 1202 having photoconductivity comprising a-Si(H,X) on a support 1201 for photoconductive member, said amorphous layer 1202 having a first layer region (O) 1203 containing oxygen atoms as constituent atoms and a second layer region (III) 1204 containing atoms belonging to the group III of the periodic table as constituent atoms which are distributed continuously in the layer thickness direction with more enrichment toward the side of said support 1201. In the example as shown in FIG. 12, the layer structure is such that the second layer region (III) 1204 occupies the whole region of the amorphous layer 1202 and the first layer region (O) 1203 constitutes a part of the second layer region (III) 1204, said first layer region (O) 1203 existing internally below the surface of the amorphous layer 1202.

The upper layer region 1205 of the amorphous layer 1202 contains no oxygen atom which is belived to be as a factor having effect on humid resistance and corona ion resistance, and oxygen atoms are contained only in the first layer region (O) 1203. The first layer region (O) 1203 is intended to be improved preponderantly to higher dark resistance and good adhesion by incorporation of oxygen atoms, while the upper layer region 1205 of the second layer region 1204 does not contain oxygen atoms so as to increase preponderantly the sensitivity. The oxygen atoms contained in the first layer region 1203 are contained in said first layer region (O) 1203 in such a manner that the oxygen atoms are distributed continuously and substantially uniformly in the layer thickness direction, and are also in a substantially uniform distribution in the plane parallel to the interface between the support 1201 and the amorphous layer 1202.

The first layer region (O) and the second layer retion (III) constituting the amorphous layer 1202 of the photoconductive member 1200 shown in FIG. 12 may be made similar to the layer region (O) and the layer region (III), respectively, constituting the amorphous layer 1100 of the photoconductive member shown in FIG. 11.

The layer thickness of the first layer region (O) 1203 and that of the upper layer region 1205 of the photoconductive member as shown in FIG. 12 are one of important factors for accomplishing effectively the object of the present invention, and therefore it is necessary to take good care of this point in designing of a photoconductive member so as to impart desired characteristics to the photoconductive member formed.

In the present invention, in case of the photoconductive member as shown in FIG. 12, the first layer region (O) 1203 may have a thickness of preferably 3 to 100$\mu$, more preferably 5 to 50$\mu$, most preferably 7 to 30$\mu$.

On the other hand, the upper layer region 1205 may have a thickness of preferably 0.02 to 10$\mu$, more preferably 0.03 to 5$\mu$, most preferably 0.05 to 2$\mu$.

In the photoconductive member according to the present invention, as shown in FIG. 12, the group III atoms may be contained as constituent atoms also in the upper layer region 1205 to make the amorphous layer 1205 wholly the second layer region (III) 1204. Further, it is also possible to omit the group III atoms from the upper layer region 1205, while making the first layer region (O) and the second layer region (III) the same layer region.

In a photoconductive member according to such an embodiment wherein no atom of the group III is incorporated in the upper layer region 1205, further marked effect can be exhibited particularly in repeated uses under a humid atmosphere to exhibit sufficient durability over a long period in said atmosphere.

The case where the second layer region (III) is formed within the first layer region (O) may also be mentioned as one of preferred embodiments.

In the present invention, if desired, the upper layer (surface barrier layer 103 in FIG. 1) on the amorphous layer is constituted of an amorphous material containing at least one kind of atoms selected from the group consisting of carbon atoms (C) and nitrogen atoms (N), optionally together with at least one of hydrogen atoms and halogen atoms, in a matrix of silicon atoms (these referred to comprehensively as a-$[Si_x(C,N)_{1-x}]$ $y(H,X)_{1-y}$ (where $0<x<1$, $0<y<1$)), or the upper layer is constituted of an electrically insulating metal oxide or an electrically insulating organic compound.

In the present invention, the above halogen atom (X) may preferably be F, Cl, Br or I, especially F or Cl.

Typical examples of the amorphous materials as mentioned above effectively used for constituting the upper layer may include, for example, carbon type amorphous materials such as a-$Si_aC_{1-a}$, a-$(Si_bC_{1-b})_cH_{1-c}$, a-$(Si_dC_{1-d})_eX_{1-e}$, a-$(Si_fC_{1-f})_g(H+X)_{1-g}$; nitrogen type amorphous materials such as a-$Si_hN_{1-h}$, a-$(Si_iN_{1-i})_jH_{1-j}$, a-$(Si_kN_{1-k})_lX_{l-1}$, a-$(Si_mN_{1-m})_n(H+X)_{1-n}$; etc. Further, there may also be mentioned amorphous materials containing at least two kinds of atoms of carbon (C) and nitrogen (N) as constituent atoms in the amorphous materials as set forth above (where $0 < a$, b, c, d, e, f, g, h, i, j, k, l, m, n < 1).

These amorphous materials may suitably be selected depending on the properties required for the upper layer by optimum design of the layer structure and easiness in consecutive fabrication of the amorphous layer to be provided in contact with said upper layer. In particular, from standpoint of properties, carbon type amorphous materials may preferably be selected.

The upper layer constituted of an amorphous material as mentioned above may be formed by the glow discharge method, the sputtering method, the ion implantation method, the ion plating method, the electron-beam method or the like.

When the upper layer is constituted of the amorphous material as described above, it is formed carefully so that the characteristics required may be given exactly as described.

That is, a substance constituted of silicon atoms (Si) and at least one of carbon atom (C) and nitrogen atom (N), and optionally hydrogen atom (H) and/or halogen atom (X) can take various forms from crystalline to amorphous and electrical properties from conductive through semi-conductive to insulating and from photoconductive to non-photoconductive depending on the preparation conditions. In the present invention, the preparation conditions are severely selected so that there may be formed amorphous materials which are non-photoconductive and high in dark resistance at least with respect to the light in visible region.

The contents of carbon atoms (C), nitrogen atoms (N), hydrogen atoms (H) and halogen atoms (X) in the upper layer are important factors, similarly to the conditions for preparation of the upper layer, for forming the upper layer provided with desired characteristics.

In forming the upper layer constituted of a-$Si_aC_{1-a}$, the content of carbon atoms based on silicon atoms may generally by 60 to 90 atomic %, preferably 65 to 80 atomic %, most preferably 70 to 75 atomic %, namely in terms of representation by the index a, 0.1 to 0.4, preferably 0.2 to 0.35, most preferably 0.25 to 0.3. In case of the constitution of a-$(Si_bC_{1-b})_cH_{1-c}$, the content of carbon atoms is generally 30 to 90 atomic %, preferably 40 to 90 atomic %, most preferably 50 to 80 atomic %, and the content of hydrogen atoms generally 1 to 40 atomic %, preferably 2 to 35 atomic %, most preferably 5 to 30 atomic %, namely in terms of representation by the indexes b and c, b being generally 0.1 to 0.5, preferably 0.1 to 0.35, most preferably 0.15 to 0.3, and c being generally 0.60 to 0.99, preferably 0.65 to 0.98, most preferably 0.7 to 0.95. In case of the constitution of a-$(Si_dC_{1-d})_eX_{1-e}$ or a-$(Si_fC_{1-f})_g(H+X)_{1-g}$, the content of carbon atoms is generally 40 to 90 atomic %, preferably 50 to 90 atomic %, most preferably 60 to 80 atomic %, the content of halogen atoms or the sum of the contents of halogen atoms and hydrogen atoms generally 1 to 20 atomic %, preferably 1 to 18 atomic %, most preferably 2 to 15 atomic %, and the content of hydrogen atoms, when both halogen atoms and hydrogen atoms are contained, is generally 19 atomic % or less, preferably 13 atomic % or less, namely in terms of representation by d, e, f, and g, d and f are generally 0.1 to 0.47, preferably 0.1 to 0.35, most preferably 0.15 to 0.3, e and g generally 0.82 to 0.99, preferably 0.82 to 0.99, most preferably 0.85 to 0.98.

When the upper layer is constituted of a nitrogen type amorphous material, the content of nitrogen atoms based on silicon atoms in case of a-$Si_hN_{1-h}$ is generally 43 to 60 atomic %, preferably 43 to 50 atomic %, namely in terms of representation by h, generally 0.40 to 0.57, preferably 0.5 to 0.57.

In case of the constitution of a-$(Si_iN_{1-i})_jH_{1-j}$, the content of nitrogen atoms is generally 25 to 55 atomic %, preferably 35 to 55 atomic %, and the content of hydrogen atoms generally 2 to 35 atomic %, preferably 5 to 30 atomic %, namely in terms of representation by i and j, i being generally 0.43 to 0.6, preferably 0.43 to 0.5 and j generally 0.65 to 0.98, preferably 0.7 to 0.95. In case of the constitution of a-$(Si_kN_{1-k})_lX_{1-l}$ or a-$(Si_mN_{1-m})_n(H+X)_{1-n}$, the content of nitrogen atoms is generally 30 to 60 atomic %, preferably 40 to 60 atomic %, the content of halogen atoms or the sum of contents of halogen atoms and hydrogen atoms generally 1 to 20 atomic %, preferably 2 to 15 atomic %, and the content of hydrogen atoms, when both halogen atoms and hydrogen atoms are contained, is generally 19 atomic % or less, preferably 13 atomic % or less, namely in terms of representation by k, l, m and n, k and l being generally 0.43 to 0.60, preferably 0.43 to 0.49, and m and n generally 0.8 to 0.99, preferably 0.85 to 0.98.

As the electrically insulating metal oxide for constituting the upper layer, there may preferably be mentioned $TiO_2$, $Ce_2O_3$, $ZrO_2$, $HfO_2$, $GeO_2$, $CaO$, $BeO$, $Y_2O_3$, $Cr_2O_3$, $Al_2O_3$, $MgO$, $MgO \cdot Al_2O_3$, $SiO_2 \cdot MgO$, etc. A mixture of two or more kinds of these compounds may also be used to form the upper layer.

The upper layer constituted of an electrically insulating metal oxide may be formed by the vacuum deposition method, the CVD (chemical vapor deposition) method, the glow discharge decomposition method, the sputtering method, the ion implantation method, the ion plating method, the electron-beam method or the like.

The numerical range of the layer thickness of the upper layer is an important factor to achieve effectively the above-mentioned purpose. If the layer thickness is too thin, the function of preventing the flowing of charges from the side of the surface of the upper layer into the amorphous layer cannot sufficiently be fulfilled. On the other hand, if the thickness is too thick, the probability of combination of the photo-carriers generated in the amorphous layer with the charges existing on the surface of upper layer will become very small. Thus, in any of the cases, the objects by provision of an upper layer cannot effectively be achieved.

In view of the above points, a thickness of the upper layer for effective achievement of the object by provision of an upper layer is generally in the range of from 30 Å to 5µ, preferably from 50 Å to 1µ.

The support to be used in the present invention may be either electroconductive or insulating. As the electroconductive support, there may be mentioned metals such as NiCr, stainless steel, Al, Cr, Mo, Au, Nb, Ta, V, Ti, Pt, Pd, etc. or alloys thereof.

As insulating supports, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and the like. These insulating supports may suitably have at least one surface subjected to an electroconductivizing treatment, and it is desirable to provide other layers on the side to which said electroconductivizing treatment has been applied.

For example, electroconductivizing treatment of a glass can be effected by providing a thin film of NiCr, Al, Cr, Mo, Au, Ir, Nb, Ta, V, Ti, Pt, Pd, $In_2O_3$, $SnO_2$, ITO($In_2O_3+SnO_2$) etc. thereon. Alternatively, a synthetic resin film such as polyester film can be subjected to the electroconductivizing treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The support may be shaped in any form such as cylinders, belts, plates or others, and its form may be determined as desired. For example, when the photoconductive member 100 in FIG. 1 is to be used as an image forming member for electrophotography, it may desirably be formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be exhibited. However, in such a case, the thickness is generally 10μ or more from the points of fabrication and handling of the support as well as its mechanical strength.

In the present invention, typical examples of halogen atoms (X) which may be optionally incorporated in the amorphous layer are fluorine, chlorine, bromine and iodine, especially preferably fluorine and chlorine.

In the present invention, formation of an amorphous layer constituted of a-Si(H,X) may be conducted according to the vacuum deposition method utilizing discharging phenomenon, such as glow discharge method, sputtering method or ion-plating method. For example, for formation of an amorphous layer constituted of a-Si(H,X) according to the glow discharge method, the basic procedure comprises introducing a starting gas for introduction of hydrogen atoms (H) and/or halogen atoms (X) together with a starting gas for supplying silicon atoms (Si) into the deposition chamber which can be internally brought to reduced pressure, wherein glow discharge is generated thereby to form a layer of a-Si(H,X) on the surface of a support placed at a predetermined position in the chamber. When it is to be formed according to the sputtering method, a starting gas for introduction of hydrogen atoms (H) and/or halogen atoms (X) may be introduced into the chamber for sputtering, when effecting sputtering using the target formed of silicon (Si) in an atomsphere of an inert gas such as Ar, He or a gas mixture based on these gases.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the effective starting gas for incorporation of halogen atoms to be used in the present invention, there may be mentioned a number of halogen compounds such as halogen gases, halides, interhalogen compounds and silane derivatives substituted with halogens which are gaseous or gasifiable.

Alternatively, it is also effective in the present invention to use a gaseous or gasifiable silicon compound containing halogen atoms which is constituted of both silicon atoms and halogen atoms.

Typical examples of halogen compounds preferably used in the present invention may include halogen gases such as of fluorine, chlorine, bromine or iodine and interhalogen compounds such as BrF, ClF, $ClF_3$, $BrF_5$, $BrF_3$, $IF_3$, $IF_7$, ICl, IBr, etc.

As the silicon compound containing halogen atoms, that is, a silane derivative substituted by a halogen atoms, silicon halides such as $SiF_4$, $Fi_2F_6$, $SiCl_4$, $SiBr_4$, or the like are preferred.

When the specific photoconductive member of this invention is formed according to the glow discharge method by use of such a silicon compound containing halogen atoms, it is possible to form a photoconductive layer constituted of a-Si:X on a given support without use of a hydrogenated silicon gas as the starting gas capable of supplying Si.

In forming the amorphous layer containing halogen atoms according to the glow discharge method, the basic procedure comprises feeding a starting gas for supplying Si, namely a gas of silicon halide and a gas such as Ar, $H_2$, He, etc., at a predetermined ratio in a suitable amount into the deposition chamber for formation of an amorphous layer, followed by excitation of glow discharge to form a plasma atmosphere of these gases, thereby forming a photoconductive layer on a support. It is also possible to form a layer by mixing a gas of a silicon compound containing hydrogen atoms at a suitable ratio with these gases in order to incorporate hydrogen atoms therein.

Each of the gases for introduction of respective atoms may be either a single species or a mixture of plural species at a predetermined ratio.

For formation of an amorphous layer of a-Si(H,X) by the reactive sputtering method or the ion-plating method, for example, a target of Si is used and sputtering is effected in a suitable gas plasma atmosphere in case of the sputtering method. Alternatively, in case of ion-plating method, a polycrystalline or single crystalline silicon is placed as a vaporization source in a vapor deposition boat, and the silicon vaporization source is vaporized by heating by resistance heating method or electron beam method (EB method) thereby to permit vaporized flying substances to pass through a suitable gas plasma atmosphere.

During this procedure, in either of the sputtering method or the ion-plating method, for introduction of halogen atoms into the layer formed, a gas of a halogen compound as mentioned above or a silicon compound containing halogen as mentioned above may be introduced into the deposition chamber to form a plasma atmosphere of said gas therein.

When hydrogen atoms are to be introduced, a starting gas for introduction of hydrogen atoms such as $H_2$ and a gas such as silanes as mentioned above may be introduced into the deposition chamber for sputtering, followed by formation of a plasma atmosphere of said gases.

In the present invention, as the starting gas for introduction of halogen atoms, the halogen compounds or silicon compounds containing halogens as mentioned above can effectively be used. In addition, it is also possible to use a gaseous or gasifiable halide containing hydrogen atom as one of the constituents such as hydrogen halide, including HF, HCl, HBr, HI and the like or halo-substituted hydrogenated silicon, including $SiH_2F_2$, $SiH_2I_2$, $SiH_2Cl_2$, $SiHCl_3$, $SiH_2Br_2$, $SiHBr_3$ and the like as an effective starting material for formation of an amorphous layer.

These halides containing hydrogen atom, which can introduce hydrogen atoms very effective for controlling electrical or optical characteristics into the layer during formation of the amorphous layer simultaneously with introduction of halogen atoms, can preferably be used as the starting material for introduction of halogen atoms.

For incorporation of hydrogen atoms structurally into the amorphous layer, alternatively, $H_2$ or a gas of hydrogenated silicon, including $SiH_4$, $Si_2H_6$, $Si_3H_8$, $Si_4H_{10}$ and so on may be permitted to be co-present with a silicon compound for supplying Si in a deposition chamber, wherein discharging is excited.

For example, in case of the reactive sputtering method, a Si target is used and a gas for introduction of halogen atoms and $H_2$ gas are introduced together with, if necessary, an inert gas such as He, Ar, etc. into a deposition chamber, wherein a plasma atmosphere is formed to effect sputtering with said Si target, thereby forming an amorphous layer of a-Si(H,X) on the substrate.

Further there may also be introduced a gas such as of $B_2H_6$ or others in order to effect also doping of impurities.

The amount of hydrogen atoms (H) or halogen atoms (X) incorporated in the amorphous layer of a photoconductive layer formed in the present invention, or total amount of both of these atoms, may be preferably 1 to 40 atomic %, preferably 5 to 30 atomic %.

For controlling the amounts of hydrogen atoms (H) and/or halogen atoms (X) in the amorphous layer, the deposition support temperature and/or the amounts of the starting materials for incorporation of hydrogen atoms (H) or halogen atoms (X) to be introduced into the deposition device system, or the discharging power may be controlled.

For providing a layer region (III) containing atoms of the group III and a layer region (O) containing oxygen atoms in the amorphous layer, the starting material for introduction of atoms of the group III and the starting material for introduction of oxygen atoms are used, respectively, together with the aforesaid starting material for formation of the amorphous layer during formation of the amorphous layer according to the glow discharge method or the reactive sputtering method, and these atoms may be incorporated in the layer formed while controlling their amounts.

When the glow discharge method is used for forming the layer region (O) containing oxygen atoms and the layer region (III) containing atoms of the group III which constitute the amorphous layer, the starting gases for formation of respective layer regions comprise a gas selected as desired from the starting materials for formation of the amorphous layer as described above and a starting material for introduction of oxygen atoms and/or a starting material for introduction of atoms of the group III. As such starting materials for introduction of oxygen atoms or for introduction of atoms of the group III, there may be employed most of gaseous or gasified gasifiable substances containing at least oxygen atoms or the group III atoms as constituent atoms.

For example, for formation of the layer region (O), it is possible to use a mixture of a starting gas having oxygen atoms (O) as constituent atoms and, if necessary, a gas having hydrogen atoms (H) and/or halogen atoms (X) as constituent atoms at a desired mixing ratio. Alternatively, a mixture of a starting gas having silicon atoms (Si) as constituent atoms and a starting gas having oxygen atoms (O) and hydrogen atoms (H) as constituent atoms at a desired mixing ratio can also be used. Further, it is also possible to use a mixture of a starting gas having silicon atoms (Si) as constituent atoms and a starting gas having the three atoms of silicon atoms (Si), oxygen atoms (O) and hydrogen atoms (H) as constituent atoms.

An another method, it is also possible to use a mixture of a starting gas having silicon atoms (Si) and hydrogen atoms (H) as constituent atoms and a starting gas having oxygen atoms (O) as constituent atoms.

As typical examples of starting materials for introduction of oxygen atoms, there may be mentioned oxygen ($O_2$), ozone ($O_3$), nitrogen monoxide (NO), nitrogen dioxide ($NO_2$), dinitrogen oxide ($N_2O$), dinitrogen trioxide ($N_2O_3$), dinitrogen tetraoxide ($N_2O_4$), dinitrogen pentoxide ($N_2O_5$), nitrogen trioxide ($NO_3$), lower siloxanes containing Si, O and H as constituent atoms such as disiloxane ($H_3SiOSiH_3$), trisiloxane ($H_3SiOSiH_2OSiH_3$), and so on.

As the starting material for introduction of the group III atoms when forming the layer region (III) by using the glow discharge method, there may be effectively employed, for introduction of boron atoms, boron hydrides such as $B_2H_6$, $B_4H_{10}$, $B_5H_9$, $B_5H_{11}$, $B_6H_{10}$, $B_6H_{12}$, $B_6H_{14}$, etc. and boron halides such as $BF_3$, $BCl_3$, $BBr_3$, etc. In addition, there may also be included $AlCl_3$, $GaCl_3$, $Ga(CH_3)_3$, $InCl_3$, $TlCl_3$, and so on.

The content of the group III atoms to be introduced into the layer region (III) containing the group III atoms may be controlled freely by controlling the gas flow rate and the gas flow rate ratio of the starting materials for introduction of the group III atoms, the discharging power, the support temperature and the pressure within the deposition chamber.

For formation of a layer region (O) containing oxygen atoms by the sputtering method, a single crystalline of polycrystalline Si wafer or $SiO_2$ wafer, or a wafer containing Si and $SiO_2$ mixed therein is used as target and sputtering is effected in an atmosphere of various gases.

For example, when Si wafer is used as target, a starting gas for introduction of oxygen atoms and, if necessary hydrogen atoms and/or halogen atoms, which may be diluted with a diluting gas, if desired, is introduced into a deposition chamber for sputter to form a gas plasma therein and effect sputtering of said Si wafer.

Alternatively, Si and $SiO_2$ as separate targets or one sheet target of a mixture of Si and $SiO_2$ can be used and sputtering is effected in a gas atmosphere containing at least hydrogen atoms (H) and/or halogen atoms (X) as constituent elements. As the starting gas for introduction of oxygen atoms, there may be employed those as mentioned in the glow discharge as described above as effective gases also in case of sputtering.

In the present invention, as the diluting gas to be employed in forming the amorphous layer according to the glow discharge method or the sputtering method, there may be included so called rare gases such as He, Ne, Ar and the like as suitable ones.

The amorphous layer may have a layer thickness which may be determined suitably so that the photocarriers generated in the amorphous layer may be transported with good efficiency, and it is desired to be generally 2 to 100μ, preferably 3 to 80μ, most preferably 3 to 50μ.

As described above, the photoconductive member of the present invention designed to have layer constitution as shown in FIG. 1, FIG. 11 and FIG. 12 can overcome all of the problems as mentioned above and exhibit very excellent electrical, optical, photoconductive characteristics, dielectric strength, and good environmental characteristics in use.

In particular, when it is used as an image forming member for electrophotography, it has no influence of residual potential on image formation at all, being stable in its electrical properties with high sensitivity and having high SN ratio, excellent light fatigue resistance and repeated usage characteristics, whereby it is possible obtain repeatedly images of high quality with high density, clear halftone and high resolution.

Next, the process for producing the photoconductive member formed according to the glow discharge decomposition method is to be described.

Figure 13:
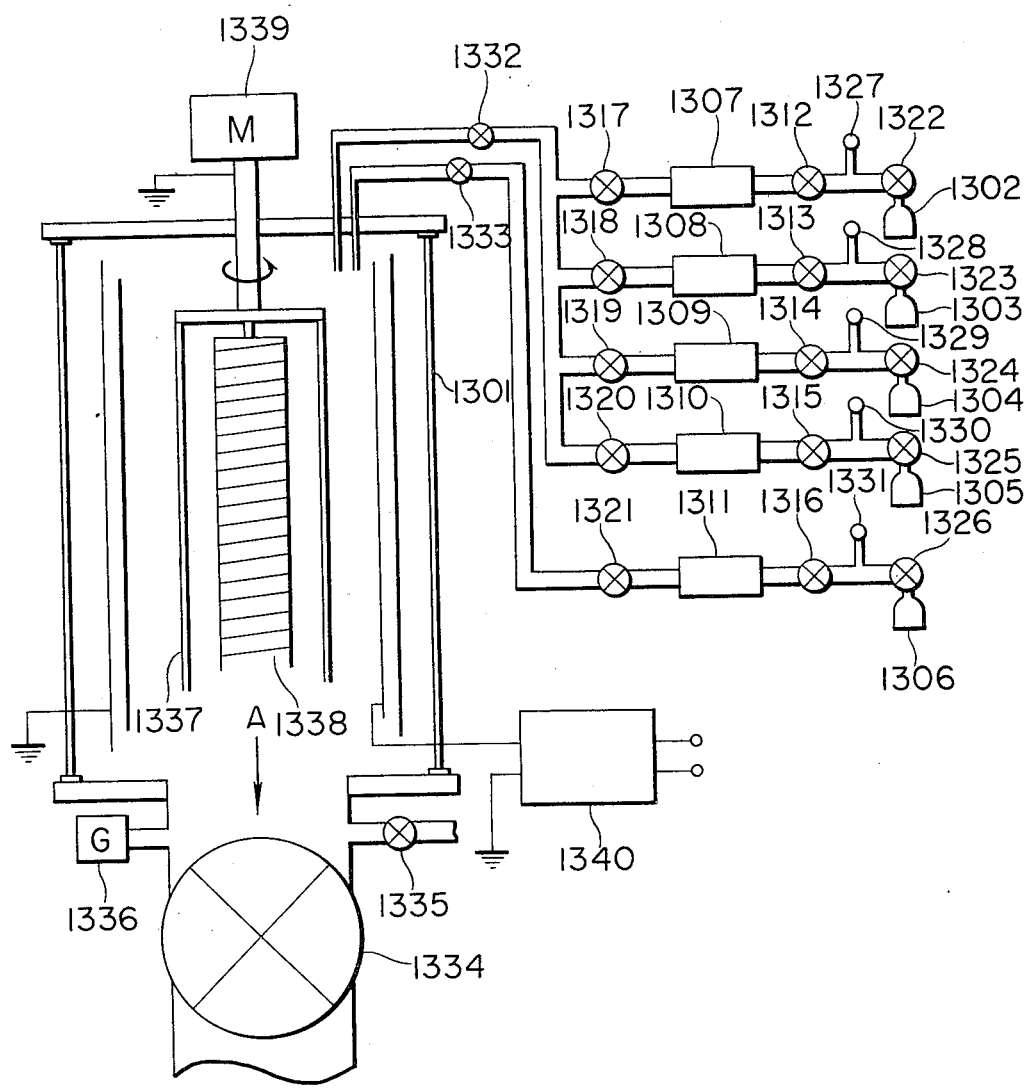
FIG. 13 shows a schematic flow chart for illustration of the device which may be used for producing the photoconductive member of the present invention.

FIG. 13 shows a device for producing a photoconductive member according to the glow discharge decomposition method.

In the gas bombs 1302, 1303, 1304, 1305 and 1306, there are hermetically contained starting gases for formation of respective layers of the present invention. For example, 1302 is a bomb containing $SiH_4$ gas diluted with He (purity: 99.999%, hereinafter abbreviated as $SiH_4/He$), 1303 is a bomb containing $B_2H_6$ gas diluted with He (purity: 99.999%, hereinafter abbreviated as $B_2H_6/He$), 1304 is a bomb containing $Si_2H_6$ gas diluted with He (purity: 99.99%, hereinafter abbreviated as $Si_2H_6/He$), 1305 is a bomb containing NO gas (purity: 99.999%), and 1306 is a bomb containing $SiF_4$ gas diluted with He (purity: 99.999%, hereinafter abbreviated as $SiF_4/He$).

For allowing these gases to flow into the reaction chamber 1301, on confirmation of the valves 1322–1325 of the gas bombs 1302–1305 and the leak valve 1335 to be closed, and the inflow valves 1312–1315, the outflow valves 1317–1320 and the auxiliary valve 1332 to be opened, the main valve 1334 is first opened to evacuate the reaction chamber 1301 and the gas pipelines. As the next step, when the reading on the vacuum indicator 1336 becomes $5\times 10^{-6}$ Torr, the auxiliary valve 1332 and the outflow valves 1317–1320 are closed.

Referring now to an example of forming a layer region (III) constituting an amorphous layer on a substrate cylinder 1337, $SiH_4/He$ gas from the gas bomb 1302, $B_2H_6/He$ gas from the gas bomb 1303 are permitted to flow into the mass-flow controllers 1307, 1308 by opening the valves 1322, 1323 to control the pressures at the outlet pressure gauges 1327, 1328 to 1 Kg/cm² and opening gradually the inflow valves 1312, 1313. Subsequently, the outflow valves 1317, 1318 and the auxiliary valve 1332 is gradually opened to permit respective gases to flow into the reaction chamber 1301. The outflow valves 1317, 1318 are controlled so that the relative flow rate ratio of $SiH_4/He$ to $B_2H_6/He$ gases may have a desired value, and opening of the main valve 1334 is also controlled while watching the reading on the vacuum indicator 1336 so that the pressure in the reaction chamber may reach a desired value. And, after confirming that the temperature of the substrate cylinder 1337 is set at 50°–400° C. by the heater 1338, the power source 1340 is set at a desired power to excite glow discharge in the reaction chamber 1301, while simultaneously performing the operation to change gradually the flow rate of $B_2H_6/He$ gas in accordance with a previously designed change ratio curve by changing the valve 1318 gradually by the manual method or by means of an externally driven motor, thereby controlling the content of B atoms as the group III atoms in the layer.

For formation of a layer region (O), NO gas is employed in place of $B_2H_6/He$ gas employed in forming the layer region (III) or in addition to said gas upon carrying out layer formation according to the same procedure as described above.

For formation of the upper layer on the amorphous layer as shown in FIG. 1, $C_2H_4$ gas may be employed in place of $B_2H_6/He$ gas employed in forming the layer region (III) to carry out layer formation.

In any of the layer regions to be formed, when halogen atoms are to be incorporated, a gas such as $SiF_4/He$ is further added to the above gases for formation of respective layer regions before charging into the reaction chamber.

For formation of the upper layer region 1205 as shown in FIG. 12, layer formation may be carried out while omitting the oxygen atom containing gas (e.g. NO) employed in the first layer region (O).

All the outflow valves other than those for gases necessary for formation of respective layers are of course closed, and during formation of respective layers, in order to avoid remaining of the gas used in the precedent layer in the reaction chamber 1301 and pipelines from the outflow valves 1317–1320 to the reaction chamber 1301, there may be conducted the procedure, comprising once evacuating to a high vacuum the system by closing the outflow valves 1317–1320 and opening the auxiliary valve 1332 with full opening of the main valve 1334, if necessary.

During formation of the layer, the substrate cylinder 1337 may be rotated at a constant speed by means of a motor 1339 in order to effect uniform layer formation.

EXAMPLE 1

Layers were formed on Al cylinders by means of the preparation device as shown in FIG. 13, with the content of boron in the layers being as parameter. The common preparation conditions and layer constitutions are as shown in Table 1, FIGS. No. 14 through No. 16 respectively.

In Table 2, there are shown contents of boron at predetermined levels, and the results of evaluation of the resultant samples. The numerals on the left column in the Table show sample numbers.

The resulting drums for forming electrophotographic images were subjected to a series of electrophotographic process of charging-imagewise exposure-development-transfer, and overall evaluations of the results with respect to density, resolution, gradation reproducibility, etc. were performed for the images visualized on transfer papers.

TABLE 1

|  | Gases employed | Flow rate (SCCM) | Layer formation rate (Å/S) | Layer thickness (μm) | Discharging power (W/cm²) | Substrate temp. (°C.) | Reaction pressure (torr) | Discharging frequency (MHz) |
|---|---|---|---|---|---|---|---|---|
| Amorphous layer Layer region (III) | $SiH_4/He = 0.5$ $B_2H_6/He = 3 \times 10^{-3}$ | $SiH_4 = 200$ suitably varied | 16 | 20 | 0.2 | 250 | 0.5 | 13.56 |

TABLE 2

| Sample No. | Position from substrate cylinder | | | | | | | | | Evaluation |
|---|---|---|---|---|---|---|---|---|---|---|
| | 0 μm | 0.1 μm | 0.2 μm | 0.5 μm | 1.0 μm | 5.0 μm | 10 μm | 15 μm | 20 μm | |
| 11 | 100 | 100 | 100 | 100 | 65 | 20 | 10 | 10 | 10 | ○ |
| 12 | 200 | 200 | 200 | 120 | 75 | 0 | 0 | 0 | 0 | ○ |
| 13 | 200 | 200 | 95 | 86 | 76 | 34 | 15 | 10 | 10 | ◎ |
| 21 | 200 | 180 | 165 | 130 | 96 | 27 | 12 | 10 | 10 | ◎ |
| 22 | 300 | 270 | 240 | 172 | 116 | 0 | 0 | 0 | 0 | ○ |
| 23 | 500 | 390 | 200 | 75 | 25 | 12 | 10 | 10 | 10 | ◎ |
| 31 | 100 | 100 | 99 | 97 | 96 | 77 | 55 | 32 | 10 | Δ |
| 32 | 200 | 200 | 200 | 98 | 96 | 78 | 55 | 32 | 10 | ○ |
| 33 | 200 | 200 | 200 | 49 | 48 | 39 | 29 | 20 | 10 | ◎ |
| 41 | 100 | 99 | 99 | 97 | 95 | 75 | 50 | 25 | 0 | ○ |
| 42 | 200 | 198 | 196 | 190 | 180 | 100 | 0 | 0 | 0 | Δ |
| 43 | 200 | 180 | 160 | 100 | 0 | 0 | 0 | 0 | 0 | ○ |
| 51 | 500 | 250 | 0 | 0 | 0 | 0 | 0 | 0 | 0 | ○ |
| 52 | 500 | 250 | 10 | 10 | 10 | 10 | 10 | 10 | 10 | ◎ |
| 53 | 100 | 90 | 85 | 55 | 10 | 10 | 10 | 10 | 10 | ○ |

The values in the Table show contents (atomic ppm) of boron, respectively.
◎: excellent
○: good
Δ: practically sufficiently useable

EXAMPLE 2

Figure 17:
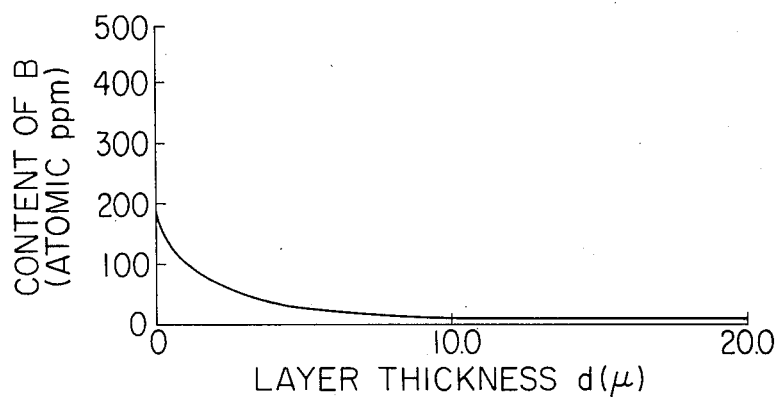
Figure 18:
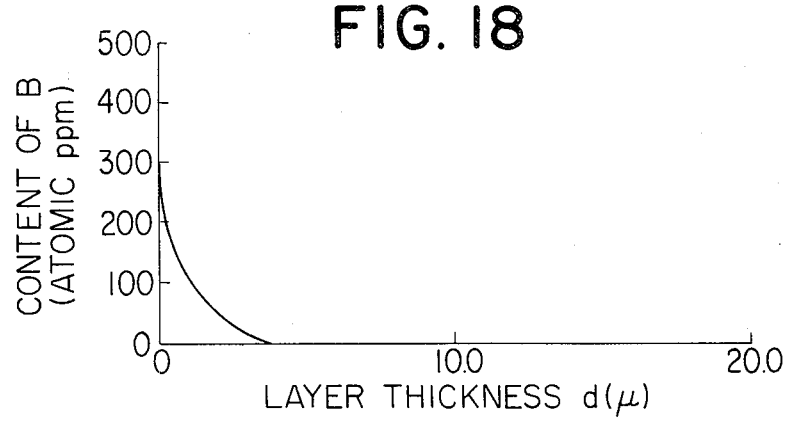
Figure 19:
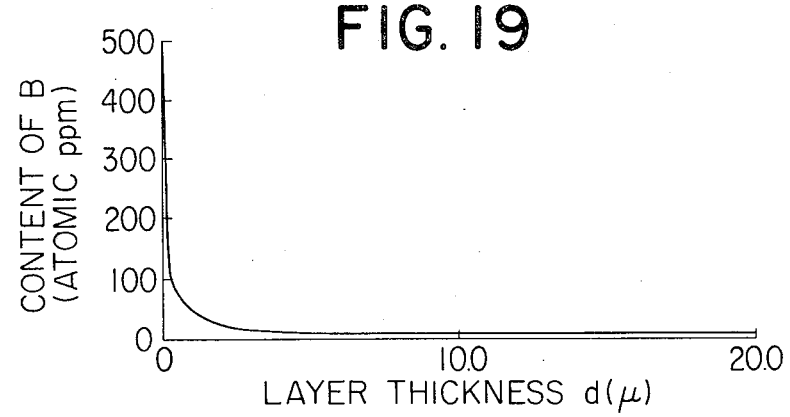

Under the same preparation conditions as in Example 1, amorphous layers having layer constitutions as shown in FIG. 17 to FIG. 19 were prepared. The results of evaluation conducted similarly as in Example 1 are shown in Table 2 (Sample No. 21 to No. 23).

EXAMPLE 3

Figure 20:
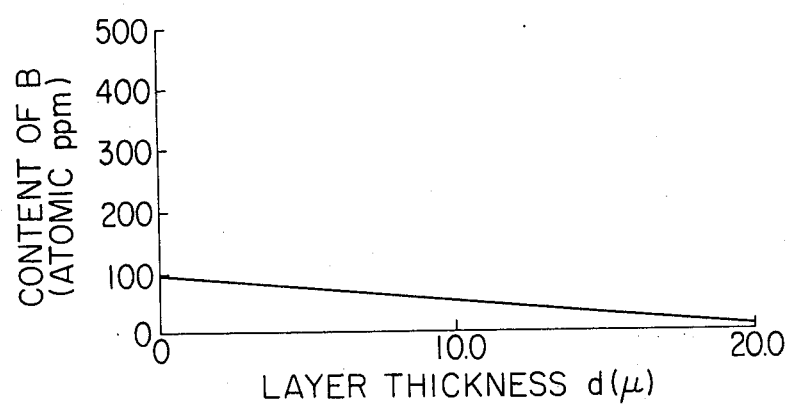
Figure 21:
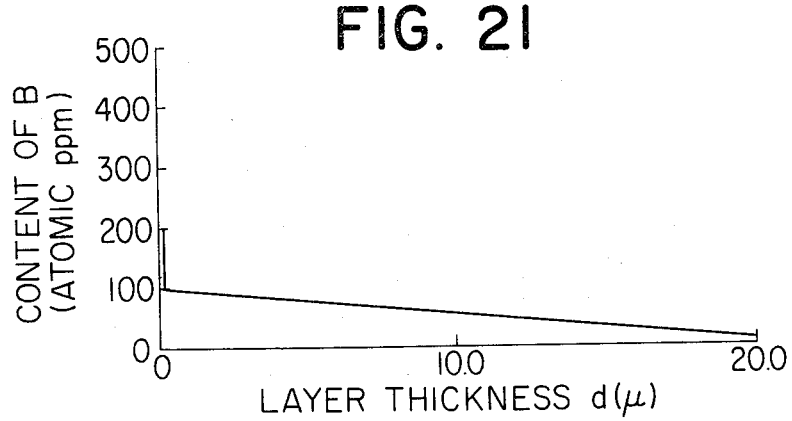
Figure 22:
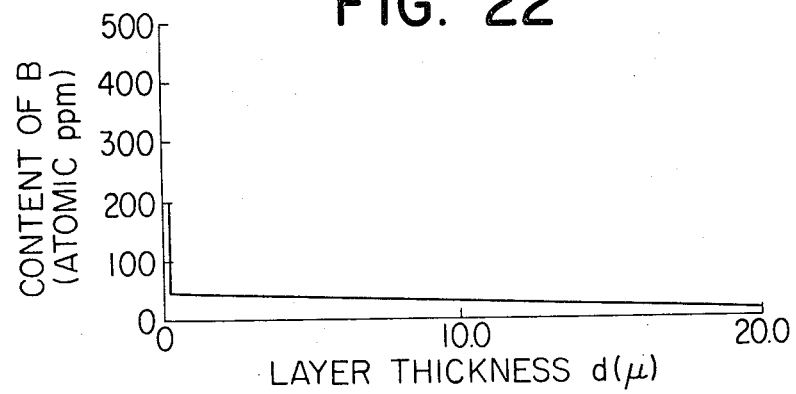

Under the same preparation conditions as in Example 1, amorphous layers having layer constitutions as shown in FIG. 20 to FIG. 22 were prepared. The results of evaluation conducted similarly as in Example 1 are shown in Table 2 (Sample No. 31 to No. 33).

EXAMPLE 4

Figure 23:
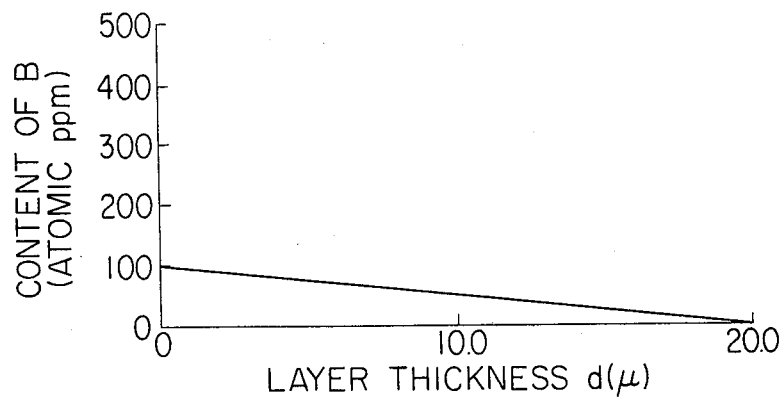
Figure 24:
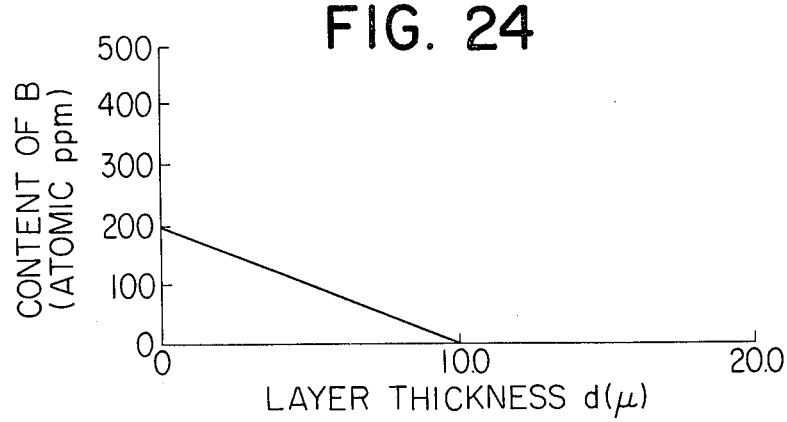
Figure 25:
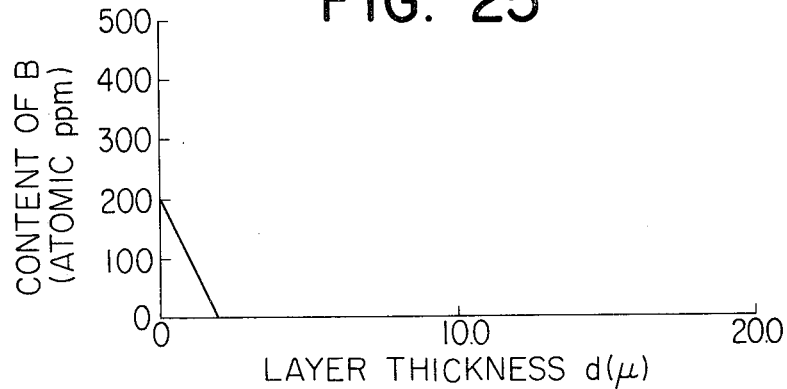

Under the same preparation conditions as in Example 1, amorphous layers having layer constitutions as shown in FIG. 23 to FIG. 25 were prepared. The results of evaluation conducted similarly as in Example 1 are shown in Table 2 (Sample No. 41 to No. 43).

EXAMPLE 5

Figure 26:
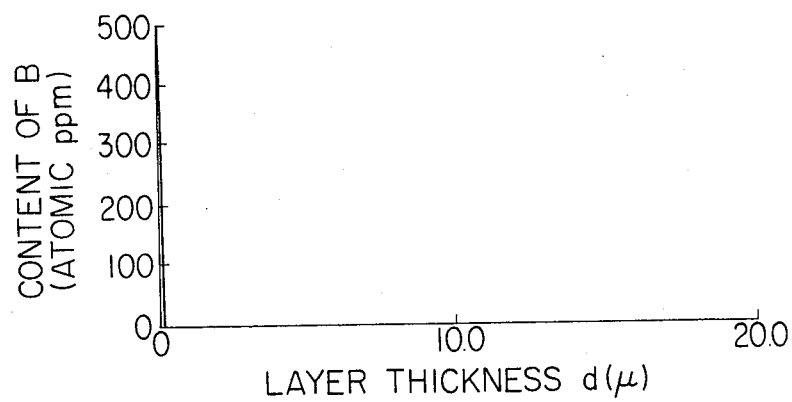
Figure 27:
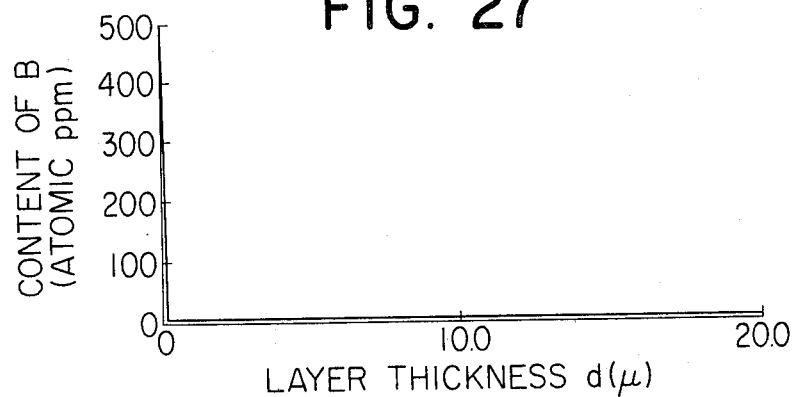
Figure 28:
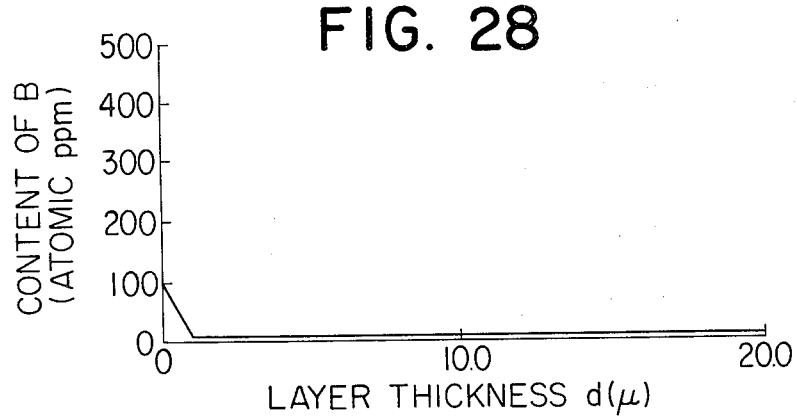

Under the same preparation conditions as in Example 1, amorphous layers having layer constitutions as shown in FIG. 26 to FIG. 28 were prepared. The results of evaluation conducted similarly as in Example 1 are shown in Table 2 (Sample No. 51 to No. 53).

EXAMPLE 6

After amorphous layers were prepared according to the same procedures for the samples (Sample No. 11–No. 53) as shown in Examples 1 to 5, respectively, the upper layers were formed under the conditions as shown in Table 3, respectively. There is no effect on the characteristics obtained, whether the vacuum may be once cancelled during this operation after formation of the amorphous layer, or formation of the upper layer may be continuously conducted under the same vacuum conditions. Preferably, however, the upper layer may be formed continuously under vacuum from the standpoint of process control.

The drums for forming electrophotographic images prepared were subjected to a series of electrophotographic process of charging-imagewise exposure-development-transfer, and overall evaluations of the results with respect to density, resolution, tone reproducibility, etc. were performed for the images visualized on transfer papers. The results are shown in Table 4 (the evaluation standards are the same as in Table 2).

TABLE 3

| Gases employed | Flow rate | Layer formation rate | Layer thickness | Discharging power | Substrate temp. | Reaction Pressure | Discharging frequency |
|---|---|---|---|---|---|---|---|
| SiH$_4$/He = 0.5 C$_2$H$_4$ 100% | SiH$_4$ = 40$_{sccM}$ C$_2$H$_4$ = 400$_{sccM}$ | 3 Å/s | 500 Å | 0.2 W/cm$^2$ | 250° C. | 0.6 Torr | 13.56 MHz |

The composition ratio of the silicon carbide layer a-(Si$_x$C$_{1-x}$)$_y$H$_{1-y}$ prepared was measured according to the Auger electron spectroscopy to be x=0.32.

TABLE 4

| Sample No. | 611 | 612 | 613 | 621 | 622 | 623 | 631 | 632 |
|---|---|---|---|---|---|---|---|---|
| Evaluation | ◎ | ◎ | ◎ | ◎ | ○ | ◎ | Δ | ◎ |
| Sample No. | 633 | 641 | 642 | 643 | 651 | 652 | 653 | |
| Evaluation | ◎ | ○ | Δ | ○ | ◎ | ◎ | ◎ | |

In Table 4, No. 611 means the sample No. 11 in Table 2 on which the upper layer was additionally provided (Sample No. 612 et seq have the same meanings).

EXAMPLE 7

Image forming members for electrophotography having the same layer constitutions as the samples (No. 11–No. 53) as shown in Example 1 to Example 5 were prepared by use of Si$_2$H$_6$/He gas in place of SiH$_4$/He gas under the conditions as shown in Table 5. The results are shown in Table 6.

TABLE 5

| Gases employed | Flow rate | Layer formation rate | Layer thickness | Discharging power | Substrate temp. | Reaction pressure | Discharging frequency |
|---|---|---|---|---|---|---|---|
| $Si_2H_6/He = 0.5$<br>$B_2H_6/He = 3 \times 10^{-3}$ | $Si_2H_6 = 200_{sccM}$ suitably varied | 50 Å/s | 20 μm | 1 w/cm² | 250° C. | 0.5 Torr | 13.56 MH$_z$ |

TABLE 6

| Sample No. | 711 | 712 | 713 | 721 | 722 | 723 | 731 | 732 |
|---|---|---|---|---|---|---|---|---|
| Evaluation | ○ | ○ | ◎ | ◎ | ○ | ◎ | △ | ○ |
| Sample No. | 733 | 741 | 742 | 743 | 751 | 752 | 753 | |
| Evaluation | ◎ | ○ | △ | ○ | ○ | ◎ | ○ | |

In Table 6, No. 711 means the sample having a layer constitution equal to No. 11 in Table 2 (All the samples of No. 712 et seq have the same meanings).

EXAMPLE 8

Image forming members for electrophotography having the same layer constitutions as Sample No. 13, No. 21, No. 23, No. 33 and No. 52 of the samples in Example 1 to Example 5 were prepared by further adding $SiF_4/He$ gas to $SiH_4/He$ gas. The mixing ratio of $SiF_4$ to $SiH_4$, namely $(SiF_4/(SiH_4+SiF_4)) \times 100\%$ was made 30 vol. %, other preparation conditions and operational procedures being the same as in Example 1. The thus prepared photosensitive drums were used for image formation on transfer under a series of electrophotographic process. The results of evaluation as in Example 1 indicate that each image obtained has high density and high resolution, and is also excellent in graduation reproducivility.

EXAMPLE 9

Figure 14:
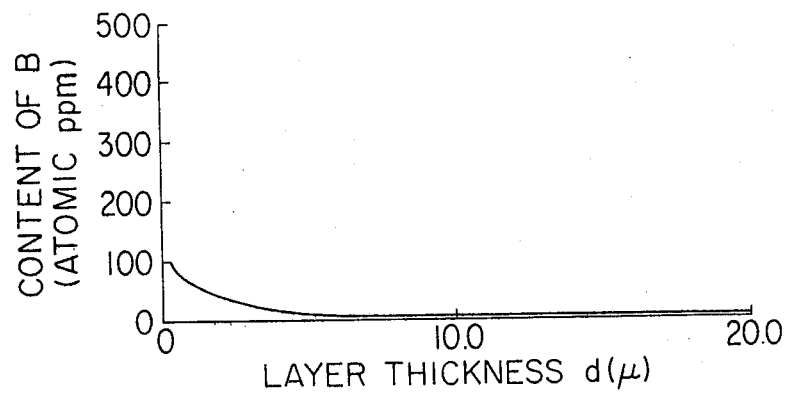
Figure 15:
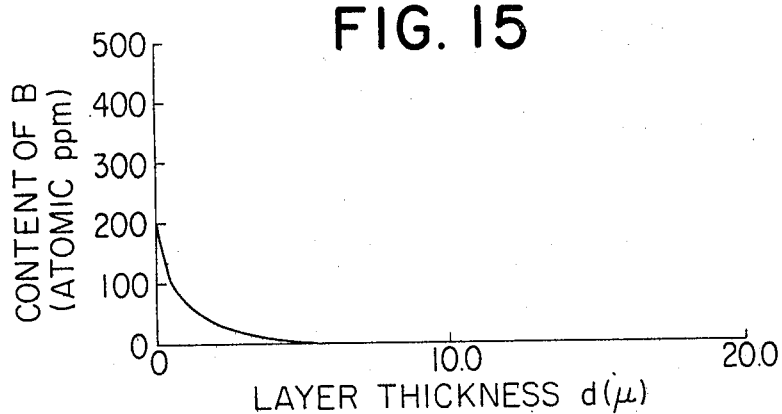
Figure 16:
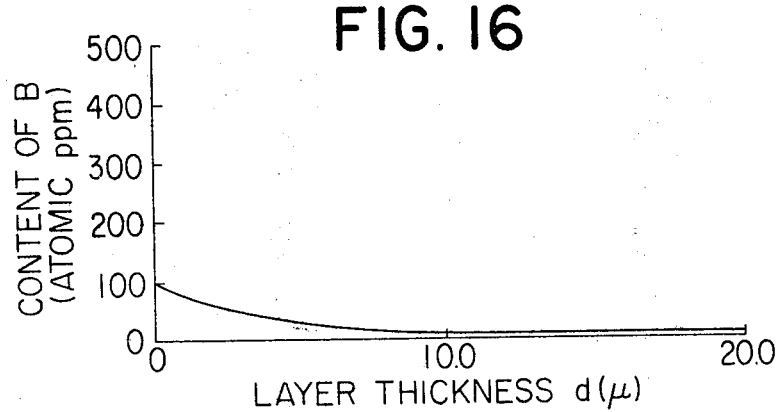

Layers were formed on Al cylinders by means of the preparation device as shown in FIG. 13, with the content of boron in the layers being as parameter. The common preparation conditions are shown in Table 7 and the concentration distributions of boron (B) in the direction of layer thickness in amorphous layers are shown in FIGS. 14 through 16, respectively.

In Table 8, there are shown contents of boron at respective positions in the direction of layer thickness and the results of evaluation of the resultant samples (No. 111–No. 113). The numerals on the left column in the Table show sample numbers.

The members for forming electrophotographic images prepared were subjected to a series of electrophotographic process of charging-imagewise exposure-development-transfer, and overall evaluations of the results with respect to density, resolution, tone reproducivility, etc. were performed for the images visualized on transfer papers.

TABLE 7

| | Gases employed | Flow rate (SCCM) | Flow rate ratio | Layer formation rate (Å/S) | Layer thickness (μm) | Discharging power (W/cm²) | Substrate temp. (°C.) | Reaction pressure (torr) | Discharging frequency (MH$_z$) |
|---|---|---|---|---|---|---|---|---|---|
| Amorphous layer forming conditions | $SiH_4/He = 0.5$<br>$B_2H_6/He = 3 \times 10^{-3}$<br>NO | $SiH_4 = 200$ suitably varied | $NO/SiH_4 = 4 \times 10^{-2}$ | 16 | 20 | 0.2 | 250 | 0.5 | 13.56 |

TABLE 8

| | Position from substrate cylinder | | | | | | | | | |
|---|---|---|---|---|---|---|---|---|---|---|
| Sample No. | 0 μm | 0.1 μm | 0.2 μm | 0.5 μm | 1.0 μm | 5.0 μm | 10 μm | 15 μm | 20 μm | Evaluation |
| 111 | 100 | 100 | 100 | 100 | 65 | 20 | 10 | 10 | 10 | ○ |
| 112 | 200 | 200 | 200 | 120 | 75 | 0 | 0 | 0 | 0 | ○ |
| 113 | 200 | 200 | 95 | 86 | 76 | 34 | 15 | 10 | 10 | ◎ |
| 121 | 200 | 180 | 165 | 130 | 96 | 27 | 12 | 10 | 10 | ◎ |
| 122 | 300 | 270 | 240 | 172 | 116 | 0 | 0 | 0 | 0 | ○ |
| 123 | 500 | 390 | 200 | 75 | 25 | 12 | 10 | 10 | 10 | ◎ |
| 131 | 100 | 100 | 99 | 97 | 96 | 77 | 55 | 32 | 10 | △ |
| 132 | 200 | 200 | 200 | 98 | 96 | 78 | 55 | 32 | 10 | ○ |
| 133 | 200 | 200 | 200 | 49 | 48 | 39 | 29 | 20 | 10 | ◎ |
| 141 | 100 | 99 | 99 | 97 | 95 | 75 | 50 | 25 | 0 | ○ |
| 142 | 200 | 198 | 196 | 190 | 180 | 100 | 0 | 0 | 0 | △ |
| 143 | 200 | 180 | 160 | 100 | 0 | 0 | 0 | 0 | 0 | ○ |
| 151 | 500 | 250 | 0 | 0 | 0 | 0 | 0 | 0 | 0 | ○ |
| 152 | 500 | 250 | 10 | 10 | 10 | 10 | 10 | 10 | 10 | ◎ |
| 153 | 100 | 90 | 85 | 55 | 10 | 10 | 10 | 10 | 10 | ○ |

◎ The values in the Table indicate contents of boron (atomic ppm), respectively.
: excellent
○ : good
△: practically sufficiently useable

EXAMPLE 10

Under the same preparation conditions as in Example 9, except that the contents of boron (B) in the amorphous layers were changed as shown in FIGS. 17 to 19, amorphous layers were prepared on Al cylinders, and the same evaluations were performed to obtain the results as shown in Table 8 (Sample No. 121 to No. 123).

EXAMPLE 11

Under the same preparation conditions as in Example 9, except that the contents of boron (B) in the amorphous layers were changed as shown in FIGS. 20 to 22, amorphous layers were prepared on Al cylinders, and the same evaluations were performed to obtain the results as shown in Table 8 (Sample No. 131 to No. 133).

EXAMPLE 12

Under the same preparation conditions as in Example 9, except that the contents of boron (B) in the amorphous layers were changed as shown in FIGS. 23 to 25, amorphous layers were prepared on Al cylinders, and the same evaluations were performed to obtain the results as shown in Table 8 (Sample No. 141 to No. 143).

EXAMPLE 13

Under the same preparation conditions as in Example 9, except that the contents of boron (B) in the amorphous layers were changed as shown in FIGS. 26 to 28, amorphous layers were prepared on Al cylinders, and the same evaluations were performed to obtain the results as shown in Table 8 (Sample No. 151 to No. 153).

EXAMPLE 14

Image forming members (Sample No. 1611–1653) for electrophotography having the same content distributions of boron (B) as the samples (No. 111–No. 153) as shown in Example 9 to Example 13 were prepared by use of $Si_2H_6$/He gas in place of $SiH_4$/He gas under the conditions as shown in Table 9, and evaluations thereof were performed similarly. The results are shown in Table 10.

In Table 10, No. 1611 means the sample having the content distribution of boron (B) equal to Sample No. 111 in Table 8.

EXAMPLE 15

Image forming members for electrophotography with layer constitutions having the same content distributions of boron (B) as Sample No. 113, No. 121, No. 123, No. 133 and No. 152 of the samples in Example 9 to Example 13 were prepared by further adding $SiF_4$/He gas to $SiH_4$/He gas. The mixing ratio of $SiF_4$ to $SiH_4$, namely $(SiF_4/(SiH_4+SiF_4))\times 100\%$ was made 30 vol. %, other preparation conditions and operational procedures being the same as in Example 9. The thus prepared image forming members for electrophotography were used for image formation on transfer papers under a series of electrophotographic process. The results of evaluation as in Example 1 indicate that each image obtained has high density and high resolution, and is also excellent in gradation reproducibility.

EXAMPLE 16

Layers were formed on Al cylinders by means of the preparation device as shown in FIG. 13, with the content of boron in the layers being as parameter. The common preparation conditions are as shown in Table 11, and the distribution of concentration of boron (B) in the amorphous layer in the direction of layer thickness are shown in FIGS. 14 through 16.

In Table 12, there are shown contents of boron at respective positions in the direction of layer thickness, and the results of evaluation of the resultant samples (No. 211–No. 213). The numerals on the left column in the Table show sample numbers.

The members for forming electrophotographic images prepared were subjected to a series of electrophotographic process of charging-imagewise exposure-development-transfer, and overall evaluations of the results with respect to density, resolution, gradation reproducibility, etc. were performed for the images visualized on transfer papers.

TABLE 9

| | Gases employed | Flow rate (SCCM) | Flow rate ratio | Layer formation rate (Å/S) | Layer thickness (μm) | Discharging power (W/cm²) | Substate temp. (°C.) | Reaction pressure (torr) | Discharging frequency (MHz) |
|---|---|---|---|---|---|---|---|---|---|
| Amorphous layer, forming conditions | $Si_2H_6$/He = 0.5 $B_2H_6$/He = $3\times 10^{-3}$ NO | $Si_2H_6$ = 200 Suitably varied | NO/$Si_2H_6$ = $15\times 10^{-2}$ | 50 | 20 | 1 | 250 | 0.5 | 13.56 |

TABLE 10

| Sample No. | 1611 | 1612 | 1613 | 1621 | 1622 | 1623 | 1631 | 1632 |
|---|---|---|---|---|---|---|---|---|
| Evaluation | Δ | Δ | ◎ | ◎ | ○ | ◎ | Δ | ◎ |

TABLE 10-continued

| Sample No. | 1633 | 1641 | 1642 | 1643 | 1651 | 1652 | 1653 |
|---|---|---|---|---|---|---|---|
| Evaluation | ◎ | ○ | Δ | ○ | ○ | ◎ | ○ |

TABLE 11

| | | Gases employed | Flow rate (SCCM) | Flow rate ratio | Layer formation rate (Å/S) | Layer thickness (μm) | Discharging power (W/cm²) | Substrate temp. (°C.) | Reaction pressure (torr) | Discharging frequency (MHz) |
|---|---|---|---|---|---|---|---|---|---|---|
| Amorphous layer forming conditions | Layer region (B,O) | $SiH_4$/He = 0.5 $B_2H_6$/He = $3\times 10^{-3}$ | $SiH_4$ = 200 suitably varied | NO/$SiH_4$ = $4\times 10^{-2}$ | 16 | 20 | 0.2 | 250 | 0.5 | 13.56 |

TABLE 11-continued

|  |  | Gases employed | Flow rate (SCCM) | Flow rate ratio | Layer formation rate (Å/S) | Layer thickness (μm) | Discharging power (W/cm²) | Substrate temp. (°C.) | Reaction pressure (torr) | Discharging frequency (MH$_z$) |
|---|---|---|---|---|---|---|---|---|---|---|
|  | Upper layer region | NO SiH$_4$/He = 0.5 | 300 |  |  | 5 |  |  |  |  |

TABLE 12

| Sample No. | Position from substrate cylinder | | | | | | | | | Evaluation |
|---|---|---|---|---|---|---|---|---|---|---|
|  | 0 μm | 0.1 μm | 0.2 μm | 0.5 μm | 1.0 μm | 5.0 μm | 10 μm | 15 μm | 20 μm |  |
| 211 | 100 | 100 | 100 | 100 | 65 | 20 | 10 | 10 | 10 | ◯ |
| 212 | 200 | 200 | 200 | 120 | 75 | 0 | 0 | 0 | 0 | ◯ |
| 213 | 200 | 200 | 95 | 86 | 76 | 34 | 15 | 10 | 10 | ◎ |
| 221 | 200 | 180 | 165 | 130 | 96 | 27 | 12 | 10 | 10 | ◎ |
| 222 | 300 | 270 | 240 | 172 | 116 | 0 | 0 | 0 | 0 | ◯ |
| 223 | 500 | 390 | 200 | 75 | 25 | 12 | 10 | 10 | 10 | ◎ |
| 231 | 100 | 100 | 99 | 97 | 96 | 77 | 55 | 32 | 10 | Δ |
| 232 | 200 | 200 | 200 | 98 | 96 | 78 | 55 | 32 | 10 | ◯ |
| 233 | 200 | 200 | 200 | 49 | 48 | 39 | 29 | 20 | 10 | ◎ |
| 241 | 100 | 99 | 99 | 97 | 95 | 75 | 50 | 25 | 0 | ◯ |
| 242 | 200 | 198 | 196 | 190 | 180 | 100 | 0 | 0 | 0 | Δ |
| 243 | 200 | 180 | 160 | 100 | 0 | 0 | 0 | 0 | 0 | ◯ |
| 251 | 500 | 250 | 0 | 0 | 0 | 0 | 0 | 0 | 0 | ◯ |
| 252 | 500 | 250 | 10 | 10 | 10 | 10 | 10 | 10 | 10 | ◎ |
| 253 | 100 | 90 | 85 | 55 | 10 | 10 | 10 | 10 | 10 | ◯ |

The values in the Table indicate contents of boron (atomic ppm), respectively.
◎: excellent
◯: good
Δ: practically sufficiently useable

EXAMPLE 17

Under the same preparation conditions as in Example 16, except that the contents of boron (B) in the amorphous layers were changed as shown in FIGS. 17 to 19, amorphous layers were prepared on Al cylinders, and the same evaluations were performed to obtain the results as shown in Table 12 (Sample No. 221 to No. 223).

EXAMPLE 18

Under the same preparation conditions as in Example 16, except that the contents of boron (B) in the amorphous layers were changed as shown in FIGS. 20 to 22, amorphous layers were prepared on Al cylinders, and the same evaluations were performed to obtain the results as shown in Table 12 (Sample No. 231 to No. 233).

EXAMPLE 19

Under the same preparation conditions as in Example 16, except that the contents of boron (B) in the amorphous layers were changed as shown in FIGS. 23 to 25, amorphous layers were prepared on Al cylinders, and the same evaluations were performed to obtain the results as shown in Table 12 (Sample No. 241 to No. 243).

EXAMPLE 20

Under the same preparation conditions as in Example 16, except that the contents of boron (B) in the amorphous layers were changed as shown in FIGS. 26 to 28, amorphous layers were prepared on Al cylinders, and the same evaluations were performed to obtain the results as shown in Table 12 (Sample No. 251 to No. 253).

EXAMPLE 21

Image forming members for electrophotography (Sample No. 2611–No. 2653) having the boron (B) distribution similar to the samples in Examples 16–20 (Sample Nos. 211–253) were prepared following the conditions in Table 13 by using Si$_2$H$_6$/He gas in place of SiH$_4$/He gas and were evaluated in the same way. The results are shown in Table 14.

TABLE 13

|  |  | Gases employed | Flow rate (SCCM) | Flow rate ratio | Layer formation rate (Å/S) | Layer thickness (μm) | Discharging power (W/cm²) | Substrate temp. (°C.) | Reaction pressure (torr) | Discharging frequency (MH$_z$) |
|---|---|---|---|---|---|---|---|---|---|---|
| Amorphous layer forming conditions | Layer region (B,O) | Si$_2$H$_6$/He = 0.5<br>B$_2$H$_6$/He = 3 × 10$^{-3}$<br>NO | Si$_2$H$_6$ = 200<br>Suitably varied | NO/Si$_2$H$_6$ = 15 × 10$^{-2}$ | 50 | 20 | 1 | 250 | 0.5 | 13.56 |
|  | Upper layer region | Si$_2$H$_6$/He = 0.5 | Si$_2$H$_6$ = 300 |  |  |  |  |  |  |  |

TABLE 14

| Sample No. | 2611 | 2612 | 2613 | 2621 | 2622 | 2623 | 2631 | 2632 |
|---|---|---|---|---|---|---|---|---|
| Evaluation | Δ | Δ | ◎ | ◎ | ○ | ◎ | Δ | ◎ |
| Sample No. | 2633 | 2641 | 2642 | 2643 | 2651 | 2652 | 2653 | |
| Evaluation | ◎ | ○ | Δ | ○ | ○ | ◎ | ○ | |

In Table 14, for example, Sample No. 2611 means the sample having the content distribution of boron (B) equal to that of Sample No. 211 in Table 12.

EXAMPLE 22

Image forming members for electrophotography with layer constitutions having the same content distributions of boron (B) as Sample No. 213, No. 221, No. 223, No. 233 and No. 252 of the samples in Example 16 to Example 20 were prepared by further adding $SiF_4/He$ gas to $SiH_4/He$ gas. The mixing ratio of $SiF_4$ to $SiH_4$, namely $(SiF_4/(SiH_4+SiF_4)) \times 100\%$ was made 30 vol. %, other preparation conditions and operational procedures being the same as in Example 16. The thus prepared image forming members for electrophotography were used for image formation on transfer papers under a series of electrophotographic process. The results of evaluation as in Example 15 indicate that each image obtained has high density and high resolution, and is also excellent in gradation reproducibility.

What we claim is:

1. A photoconductive member which comprises a support for a photoconductive member and an amorphous layer having photoconductivity constituted of an amorphous material comprising silicon atoms as a matrix and at least one member selected from hydrogen atoms and halogen atoms as constituent atoms, said amorphous layer having a layer region which contains atoms belonging to the group III of the periodic table as constituent atoms in such a distribution that the distribution is continuous in the direction of layer thickness and said atoms are more enriched on the aforesaid support side than on the opposite side to the aforesaid support side in said layer.

2. A photoconductive member which comprises a support for a photoconductive member and an amorphous layer having photoconductive constituted of an amorphous material comprising silicon atoms as a matrix and at least one member selected from hydrogen atoms and halogen atoms as constituent atoms, said amorphous layer having a first layer region which contains oxygen atoms as constituent atoms in a substantially uniform distribution which is continuous in the direction of layer thickness and a second layer region which contains atoms belonging to the group III of the periodic table as constituent atoms in such a distribution that the distribution is continuous in the direction of layer thickness and said atoms are more enriched on the aforesaid support side in said layer.

3. A photoconductive member according to claim 1, wherein the layer region containing the atoms belonging to the group III of the periodic table occupies substantially the entire layer region of the amorphous layer.

4. A photoconductive member according to claim 1, wherein the layer region containing the atoms belonging to the group III of the periodic table is provided as the end portion layer region of amorphous layer on the side of the support.

5. A photoconductive member according to claim 2, wherein said first region exists internally below the surface of said amorphous layer.

6. A photoconductive member according to claim 2, wherein the first layer region and the second layer region share at least a part thereof.

7. A photoconductive member according to claim 2, wherein the first layer region occupies substantially the entire layer region of the amorphous layer.

8. A photoconductive member according to claim 2, wherein the first layer region and the second layer region are identical.

9. A photoconductive member according to claim 1, wherein an upper barrier layer is provided on the amorphous layer.

10. A photoconductive member according to claim 1, wherein there is provided an upper layer constituted of an amorphous material containing at least one member selected from carbon atoms and nitrogen atoms in a matrix of silicon atoms on the amorphous layer.

11. A photoconductive member according to claim 10, wherein the amorphous material further contains at least one member selected from hydrogen atoms and halogen atoms as constituent atoms.

12. A photoconductive member according to claim 1, wherein hydrogen atoms are contained in the amorphous layer.

13. A photoconductive member according to claim 12, wherein the content of hydrogen atoms is 1 to 40 atomic %.

14. A photoconductive member according to claim 1, wherein halogen atoms are contained in the amorphous layer.

15. A photoconductive member according to claim 14, wherein the content of halogen atoms is 1 to 40 atomic %.

16. A photoconductive member according to claim 1, wherein hydrogen atoms and halogen atoms are contained in the amorphous layer.

17. A photoconductive member according to claim 16, wherein the sum of the contents of hydrogen atoms and halogen atoms is 1 to 40 atomic %.

18. A photoconductive member according to claim 2, wherein an upper barrier layer is provided on the amorphous layer.

19. A photoconductive member according to claim 2, wherein there is provided an upper layer constituted of an amorphous material containing at least one member selected from carbon atoms and nitrogen atoms in a matrix of silicon atoms on the amorphous layer.

20. A photoconductive member according to claim 19, wherein the amorphous material further contains at least one member selected from hydrogen atoms and halogen atoms as constituent atoms.

21. A photoconductive member according to claim 2, wherein hydrogen atoms are contained in the amorphous layer.

22. A photoconductive member according to claim 21, wherein the content of hydrogen atoms is 1 to 40 atomic %.

23. A photoconductive member according to claim 2, wherein halogen atoms are contained in the amorphous layer.

24. A photoconductive member according to claim 23, wherein the content of halogen atoms is 1 to 40 atomic %.

25. A photoconductive member according to claim 2, wherein hydrogen atoms and halogen atoms are contained in the amorphous layer.

26. A photoconductive member according to claim 25, wherein the sum of the contents of hydrogen atoms and halogen atoms is 1 to 40 atomic %.

* * * * *